United States Patent [19]

Watanabe

[11] Patent Number: 4,493,046

[45] Date of Patent: Jan. 8, 1985

[54] APPARATUS FOR GENERATION OF BINARY PSEUDO-RANDOM NUMBERS

[75] Inventor: Tadashi Watanabe, Tokyo, Japan

[73] Assignee: Nippon Electric Co., Ltd, Japan

[21] Appl. No.: 381,714

[22] Filed: May 24, 1982

[30] Foreign Application Priority Data

May 26, 1981 [JP] Japan .................................. 56-79518

[51] Int. Cl.³ .......................... H03K 3/84; G06F 7/38
[52] U.S. Cl. .................................................. 364/717
[58] Field of Search .......................... 364/717; 331/78

[56] References Cited

U.S. PATENT DOCUMENTS

| | | | |
|---|---|---|---|
| 3,984,668 | 10/1976 | Zetterberg | 364/717 |
| 4,047,008 | 9/1977 | Perkins | 364/717 |
| 4,213,101 | 7/1980 | Policard et al. | 331/78 |
| 4,325,129 | 4/1982 | Groth, Jr. | 364/717 |

OTHER PUBLICATIONS

Lawrence et al., "Fast Pseudo-Random Number Generator", *Navy Tech. Disclosure Bulletin*, vol. 4, No. 1, Jan. 1979, pp. 23–32.

Groth, "Generation of Binary Sequences with Controllable Complexity", *IEEE Trans. on Information Theory*, vol. 7717, No. 3, May 1971, pp. 288–297.

Primary Examiner—David H. Malzahn
Attorney, Agent, or Firm—Blakely, Sokoloff, Taylor & Zafman

[57] ABSTRACT

Apparatus for generation of binary pseudo-random numbers of n bits by use of the maximum-length shift register sequence based on a primitive polynomial, $f(x)=x^p+x^q+1$, where p and q are positive integers satisfying the relation $p>q\geq 1$. The apparatus comprises p-bit storage means; (p−q) bit shift means for shifting the contents of said p-bit storage means; exclusive OR means for exclusive-ORing m (m≧n) bits resulting from the shifting and consecutive m bits stored in said storage means bit by bit; means for restoring exclusive-ORed results to uppermost bits of said storage means and uppermost (p−m) bits of said storage means to lowermost (p−m) bits thereof; and means for extracting uppermost n bits from said storage means.

2 Claims, 4 Drawing Figures

36 BIT BINARY PSEUDO-RANDOM NUMBERS

APPARATUS FOR GENERATION OF BINARY PSEUDO-RANDOM NUMBERS

BACKGROUND OF THE INVENTION

This invention relates to apparatus for generating binary pseudo-random numbers by use of the maximum-length shift register sequence (hereinafter simply referred to as M sequence).

The advance recently made in computer technology and various digital devices has encouraged adoption of various types of simulation and measurement based on random numbers. For example, various forms of predictive and statistical calculation, simulation of social and economic models, application and simulation in the field of physics and engineerings concerning nuclear power and nuclear fusion, and generation of test data in inspecting and measuring instruments have found use of random numbers. In these fields of application, the execution of simulation and measurement must be carried out at high speeds. Thus, apparatus capable of generating random numbers at such high speeds are in demand.

In computers, random numbers have heretofore been generated in a subroutine of the so-called software by combining instructions for arithmetic operations (addition, subtraction, multiplication, division, etc.) prepared for a computer. Particularly, a congruent method has been used widely in which division operations are predominant. To generate one random number by this method, execution of at least several instructions including those for data loading in the register, execution of divisions, and storage of the results in memories, for example, is required. Further, the execution of division takes up more than the other arithmetic operations such as addition, subtraction, and multiplication. Thus, this method has failed to generate random numbers at high speeds as generally expected.

In measuring instruments, a method has been prevalent which generates binary pseudo-random numbers by use of the M sequence. However, the conventional M sequence method is based primarily on the use of shift registers and therefore, data is produced essentially on the basis of one bit per one clock.

Heretofore, the generation of binary pseudo-random numbers by the M sequence has been effected as follows.

It is now assumed that a sequence $\{a_i\}$ of "0" and "1" is derived from an asymptotic equation, $$a_i = c_1 a_{i-1} + c_2 a_{i-2} + \ldots c_p a_{i-p} (\text{mod}.2) \qquad (1)$$

where the constants $c_1, c_2, \ldots, c_{p-2}$ and $c_{p-1}$ are "0" or "1" and $c_p$ is "1". It is provided, however, that all initial values $a_0, a_1, \ldots$ and $a_{p-1}$ are not 0 (zero).

Then, the sequence $\{a_i\}$ constitutes an M sequence having a period of $2^p - 1$ when the coefficients $c_1, c_2, \ldots$ and $c_p$ in equation (1) are selected so that a characteristic polynomial, $$f(x) = 1 + c_1 x + c_2 x^2 + \ldots + c_p x^p \qquad (2)$$

will form a primitive polynomial on a Galois field, GF(2).

Information on Galois fields may be found in, for example, "Error-correcting Code" by W. Wesley Peterson. The expression "primitive polynomial on GF(2)" designates such a nature that $x^{k-1}$ is indivisible by $f(x)$ when $0 < k < 2^p - 1$ and divisible when $k = 2^p - 1$.

The sequence $\{a_i\}$ derived from equation (1) as described above has heretofore been generated by a p-stage linear feedback shift register. It is known that binary pseudo-random numbers of n bits can be obtained with the above shift register as follows. More particularly, successive n ($\leq p$) bits of numbers (0 or 1) are extracted from the M sequence $\{a_i\}$ and arranged to form binary numbers of n-bits, $$U_k = a_{mk+r+1} a_{mk+r+2} \ldots a_{mk+r+n} \qquad (3)$$

and this sequence $\{U_k\}$ is used as binary random numbers, where r is a positive integer and m ($\leq n$) is an interval at which n bits are extracted sequentially from the sequence $\{a_i\}$. Where m and the period $2^p - 1$ are primes with respect to each other, the period of the sequence $\{U_k\}$ is $2^p - 1$. With the conventional apparatus, however, generation of binary pseudo-random numbers of n bits calls for at least n times (n clocks) of shifting operations. This requirement prevents the generation of random numbers at high speeds.

SUMMARY OF THE INVENTION

An object of this invention is to provide apparatus for generating binary pseudo-random numbers of n bits ($m \geq n$) capable of generating n-bit binary pseudo-random numbers at high speeds with a simple circuit.

Especially, when this apparatus is incorporated in a computer system as an element for issuing instructions for the generation of random numbers, binary pseudo-random numbers of a plurality of bits are generated by one instruction through one to two clocks.

According to this invention, there is provided apparatus for generation of binary pseudo-random numbers of n bits by use of the maximum-length shift register sequence based on a primitive polynomial, $f(x) = x^p + x^q + 1$, where p and q are positive integers satisfying the relation $p > q \geq 1$, said apparatus comprising:

p-bit storage means;

(p−q) bit shift means for shifting the contents of said p-bit storage means;

exclusive OR means for exclusive-ORing m (m≧n) bits resulting from the shifting and consecutive m bits stored in said storage means bit by bit;

means for restoring exclusive-ORed results to uppermost bits of said storage means and uppermost (p−m) bits of said storage means to lowermost (p−m) bits thereof; and means for extracting uppermost n bits from said storage means.

DESCRIPTION OF PREFERRED EMBODIMENT

Figure 1:
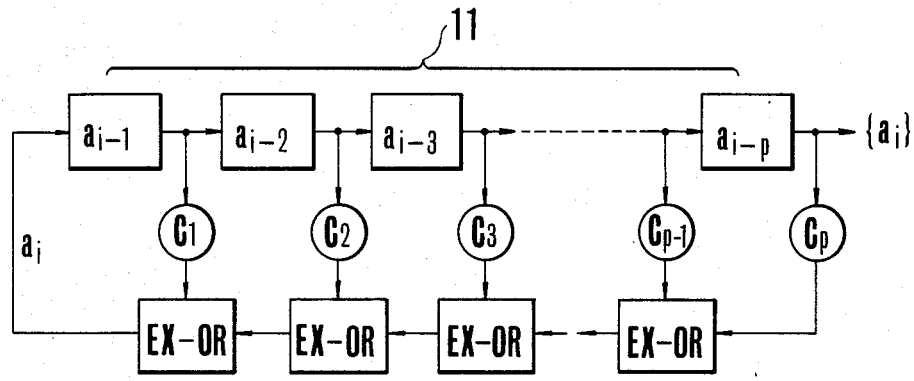
FIG. 1 is a block diagram of a conventional linear feedback type shift register for generating binary pseudo-random numbers.

FIG. 1 illustrates a conventional p-stage linear feedback shift register used for the generation of the sequence $\{U_k\}$ pursuant to equation (3) as described previously.

In accordance with the present invention, binary pseudo-random numbers of n bits are generated by use of an M sequence based on a primitive polynomial, $f(x)=x^p+x^g+1$, where p and q are positive integers satisfying the relation $p>q\geq 1$.

Figure 2:
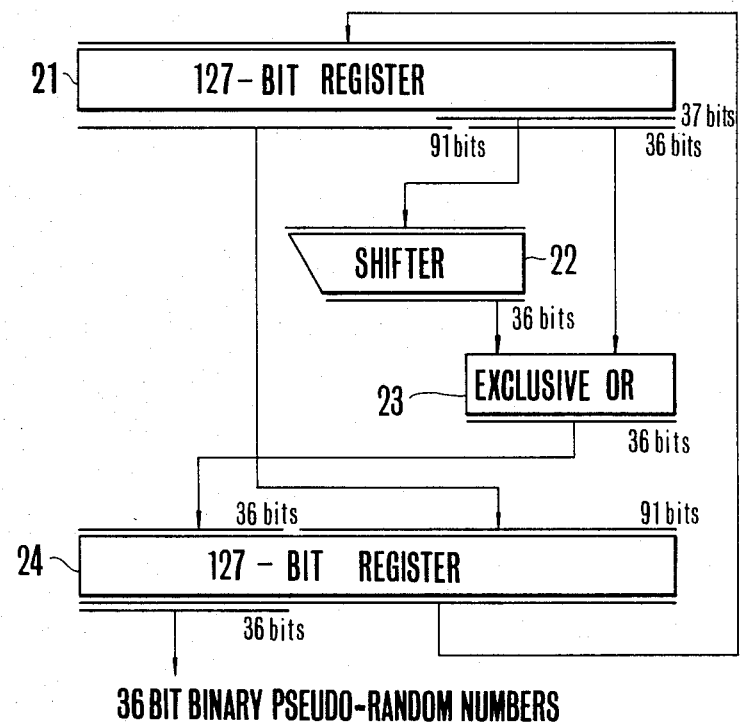
FIG. 2 is a block diagram illustrating one embodiment of this invention.

With reference to FIG. 2, it is noted that one embodiment of this invention adopts $f(x)=x^{127}+x^{126}+1$ as a primitive polynomial. Here, values of p and q are such that p=127 and q=126. In the embodiment of FIG. 2, values of m and n are such that m=36 and n=36. It is known that if $f(x)=x^p+x^q+1$ is a primitive polynomial, then $f(x)=x^p+x^{p-q}+1$ will also be a primitive polynomial.

A pseudo-random number generating apparatus of this embodiment comprises a 127-bit (p bit) register 21, a 1-bit (p−q bit) shift circuit 22, 36 exclusive OR circuits 23, and a 127-bit register 24 for holding the output of the circuits 23 and the uppermost 91 bits (p−m bit) of the register 21. The uppermost 36 bits of the register 24 define binary numbers to be obtained as pseudo-random numbers.

In operation, when initial values all of which are not zero are externally set in the register 21, lowermost 37 bits (m+p−q bits) of this value are applied to the shift circuit 22 and shifted by one bit (p −q bit). In 36 exclusive OR circuits, the 36 bits of the output of the shift circuit 22 and the lowermost 36 bits of the register 21 are exclusive-ORed bit by bit. The outputs of the exclusive OR circuits 23 are stored in uppermost 36 bits of the register 24. In the meantime, the uppermost 91 bits of the register 21 are stored in lowermost 91 bits of the register 24. The uppermost 36 bits of this register 24 are delivered out as binary random numbers and, at the same time, all the 127 bits of the register 24 are restored in the register 21 to be used for the subsequent generation of binary random numbers.

Figure 4:
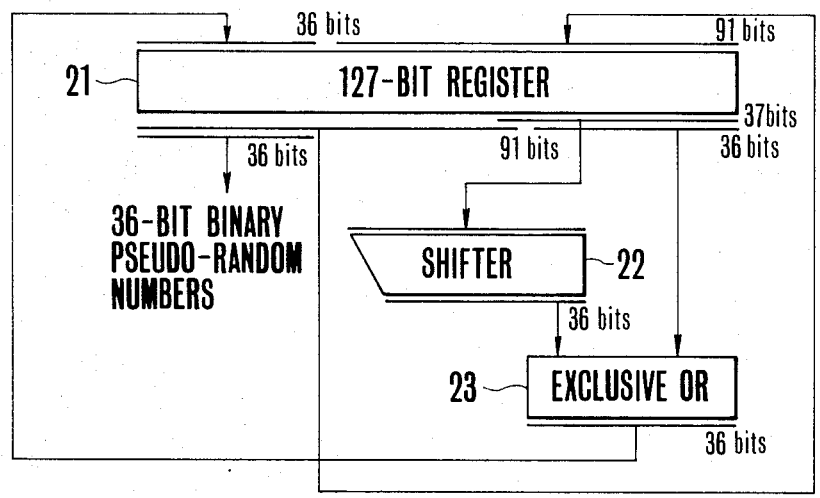
FIG. 4 is a block diagram illustrating another embodiment of the invention.

As described above, this embodiment of the invention is capable of generating one binary pseudo-random number of 36 bits with a total of two clocks, i.e. one clock covering operations from the register 21 through the register 24 and the other clock covering the operations terminating in the restoring of the contents of the register 24 in the register 21. Alternatively, as shown in FIG. 4, generation of one binary random number may be acomplished with one clock by omitting the register 24 and causing the outputs of the exclusive OR circuits and those of the register 21 to be directly restored in the register 21.

The sequences of binary random numbers $\{U_k\}$ pursuant to equation (3) are produced successively by the operation described above. This successive production of the sequences will be described in detail below.

Figure 3:
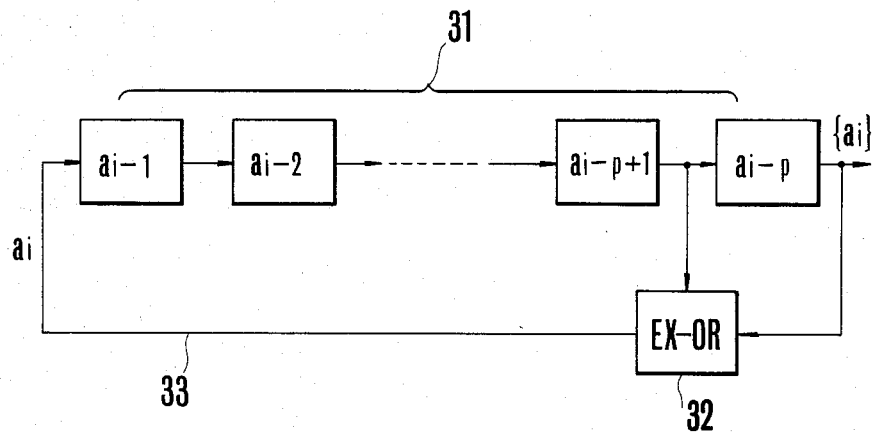
FIG. 3 is a block diagram of a linear feedback type shift register equivalent to that of FIG. 1 which is specified for a primitive polynomial, $f(x) = X^{127} + x^{126} + 1$.

FIG. 3 is a block diagram of a shift register equivalent to FIG. 1 as fulfilling the operation of the apparatus of this invention illustrated in FIG. 2. Since the primitive polynomial is $f(x)=1+x^{126}+x^{127}$, the circuit illustrated in FIG. 3 comprises a 127-stage shift register 31, an exclusive OR circuit 32 for treating the outputs from the last stage and the immediately preceding stage of the shift register, and a feedback path 33 to the shift register 31.

First, the following sequence is set as shown at section (0) in Table 1 as the initial value in the register 31 of FIG. 3.

$$a_{126}a_{125}\ldots a_2a_1a_0 \quad (4)$$

Then, this sequence is shifted to the right by one bit. Consequently, the values in the respective register stages will be as shown at section (1) in Table 1. When the shifting is continued up to the 36th bit, the results will be:

$$a_{162}a_{161}\ldots a_{38}a_{37}a_{36} \quad (5)$$

as shown at section (36) in Table 1.

TABLE 1

| | |
|---|---|
| (0) | $a_{126}a_{125}a_{124}\ldots a_1\ a_1\ a_0$ |
| (1) | $a_{127}a_{126}a_{125}\ldots a_3\ a_2\ a_1$ |
| (2) | $a_{128}a_{127}a_{126}\ldots a_4\ a_3\ a_2$ |
| . | . |
| . | . |
| . | . |
| (36) | $a_{162}a_{161}a_{160}\ldots a_{38}\ a_{37}\ a_{36}$ |

Here, the values of $a_{162}, a_{161}, \ldots, a_{127}$ are those to be produced in the exclusive OR circuit of FIG. 3 as shown below.

$$\left. \begin{array}{c} a_{127} = a_1 \oplus a_0 \\ a_{128} = a_2 \oplus a_1 \\ \cdot \\ \cdot \\ \cdot \\ a_{162} = a_{36} \oplus a_{35} \end{array} \right\} \quad (6)$$

In the apparatus represented by the block diagram of FIG. 2 as one embodiment of this invention, when the values, $a_{126}, a_{125}, \ldots, a_2, a_1$ and $a_0$ at section (0) in Table 1 are set as initial values in the register 21 in the same manner as described above, the values which are subsequently restored in the register 21 via the shift circuit 22, the exclusive OR circuits 23, and the register 24 will be as follows.

$$a_{162}a_{161}\ldots a_{38}a_{37}a_{36} \quad (7)$$

Since the shift circuit 22 of FIG. 2 is for one-bit shifting, the output thereof will be $a_{36}a_{35}\ldots a_2a_1$. Consequently, when the output of the shift circuit 22, $a_{36}a_{35}\ldots a_2a_1$ and the lowermost 36 bits of the register 21 of FIG. 2, $a_{35}a_{34}\ldots a_2a_1a_0$ are exclusive-ORed bit by bit at the exclusive OR circuits 23, there is produced therefrom an output $a_{162}a_{161}\ldots a_{127}$. The values of $a_{162}a_{161}\ldots a_{127}$ will therefore be respectively as shown below.

$$\left. \begin{array}{c} a_{127} = a_1 \oplus a_0 \\ a_{128} = a_2 \oplus a_1 \\ \cdot \\ \cdot \\ \cdot \\ a_{162} = a_{36} \oplus a_{35} \end{array} \right\} \quad (8)$$

Comparison of equations (5) and (7) and the equations (6) and (8) clearly shows that the results of the first generation of random number (the values to be restored in the register 21) by the FIG. 2 embodiment and those obtained at the end of the 36-bit shifting illustrated in FIG. 3 are perfectly identical. In the apparatus represented by the block diagram of FIG. 2, therefore, the successive n bits, $n \leq m$ (=36), extracted from the register 21 or the register 24 will constitute the binary random number sequence $\{U_k\}$ represented by the equation (3). The embodiment of this invention uses n=36 bits. The foregoing embodiment will be described with reference to specified numerical values. The following initial values will have specified numbers shown below.

$a_{126}a_{125}a_{124}a_{123}a_{122}a_{121} \ldots a_{38}a_{37}a_{36}a_{35}a_{34}$
$a_{33}a_{32}a_{31}a_{30}a_{29}a_{28}a_{27}a_{26}a_{25}a_{24}a_{23}a_{22}a_{21}$
$a_{20}a_{19}a_{18}a_{17}a_{16}a_{15}a_{14}a_{13}a_{12}a_{11}a_{10}a_9a_8$
$a_7a_6a_5a_4a_3a_2a_1a_0 = 001000\ldots 1110000001100110110$
$00010110110100010010.$ With reference to FIG. 2, the outputs of the shift circuit 22 and the register 21 are exclusive-ORed at the exclusive OR circuits 23 as follows.

$$\begin{array}{rl} a_{35}a_{34}\ldots a_0 = & 00000011001101100001011011010010 \\ \oplus\ a_{36}a_{35}\ldots a_1 = & 10000001100110110000101101101001001 \\ \hline a_{162}a_{161}\ldots a_{127} = & 100000101010110100011101101110011011 \end{array}$$

This operation produces the uppermost 36 bits of the register 24 shown in FIG. 2, which constitute pseudo-random numbers. In the meantime, the uppermost 91 bits stored in the register 21 correspond to the lowermost 91 bits of the register 24, namely, $a_{126}a_{125}a_{124}a_{123}a_{122}a_{121} \ldots a_{38}a_{37}a_{36} = 001000\ldots 111.$ The present embodiment has designated $\{U_k\}$ as a simple binary random number sequence. Alternatively, it may be handled as a uniform random number of 0 to 1 by interpreting "$U_k$" as a binary demical of $0.a_{mk+r+1}a_{mk+r+2}\ldots a_{mk+r+n}.$ This invention has an effect of enabling simple and quick generation of binary pseudo-random numbers of a plurality of bits by use of a shift circuit and bit-by-bit exclusive OR circuit.

What is claimed is:

1. Apparatus for generation of binary pseudo-random numbers of n bits by use of the maximum-length shift register sequence based on a primitive polynomial, $f(x)=x^p+x^q+1$, where p and q are positive integers satisfying the relation $p > q \geq 1$, said apparatus comprising:

p-bit storage means;
 (p−q) bit shift means for shifting the lowermost (p−q+m) bits of said p-bit storage means;
 exclusive OR means for exclusive-ORing bit by bit the lowermost m (m≧n) bits of said p-bit storage means and m bits resulting from said shifting; and
 means for restoring the uppermost (p−m) bits of said p-bit storage means to the lowermost (p−m) bits of said p-bit storage means and exclusive-Ored results to the uppermost m bits of said p-bit storage means and for extracting the uppermost n bits of said p-bit storage means.

2. Apparatus for generation of binary pseudo-random numbers of n bits by use of the maximum-length shift register sequence based on a primitive polynomial, $f(x)=x^p+x^q+1$, where p and q are positive integers satisfying the relation $p > q \geq 1$, said apparatus comprising:

first p-bit storage means;
 (p−q) bit shift means for shifting the lowermost (p−q+m) bits of said first p-bit storage means;
 exclusive OR means for exclusive-ORing bit by bit the lowermost m (m≧n) bits of said first p-bit storage means and m bits resulting from said shifting;
 second p-bit storage means; and
 means for restoring the uppermost (p−m) bits of said first p-bit storage means to the lowermost (p−m) bits of said second p-bit storage means and exclusive-ORed m-bit results to the uppermost m bits of second p-bit storage means and for extracting the uppermost n bits of said second p-bit storage means.

* * * * *